United States Patent
Hayashi et al.

(10) Patent No.: US 8,900,710 B2
(45) Date of Patent: Dec. 2, 2014

(54) LIGHT-EMITTING DEVICE, METHOD FOR MANUFACTURING SAME, AND MOLDED PART

(75) Inventors: Masaki Hayashi, Anan (JP); Hiroto Tamaki, Anan (JP); Masafumi Kuramoto, Anan (JP); Tomohide Miki, Anan (JP); Takayuki Sano, Anan (JP); Tomohisa Kishimoto, Anan (JP)

(73) Assignee: Nichia Corporation, Anan-shi (JP)

( * ) Notice: Subject to any disclaimer, the term of this patent is extended or adjusted under 35 U.S.C. 154(b) by 714 days.

(21) Appl. No.: 12/026,469

(22) Filed: Feb. 5, 2008

(65) Prior Publication Data

US 2008/0187762 A1    Aug. 7, 2008

(30) Foreign Application Priority Data

Feb. 6, 2007    (JP) .................. 2007-026693

(51) Int. Cl.
- B32B 27/38 (2006.01)
- B29C 45/02 (2006.01)
- B29C 45/28 (2006.01)
- B29K 63/00 (2006.01)

(52) U.S. Cl.
CPC .............. B29D 11/074 (2013.01); B29C 45/02 (2013.01); B29C 45/2806 (2013.01); B29K 2063/00 (2013.01)
USPC ...................................................... 428/413

(58) Field of Classification Search
USPC ....................................................... 428/413
See application file for complete search history.

(56) References Cited

U.S. PATENT DOCUMENTS

| | | | |
|---|---|---|---|
| 6,610,406 B2 * | 8/2003 | Gallo | 428/413 |
| 7,125,917 B2 * | 10/2006 | Starkey | 523/458 |
| 7,656,083 B2 | 2/2010 | Sumitani | |
| 7,683,138 B1 * | 3/2010 | Bischof | 525/396 |
| 2003/0132701 A1 | 7/2003 | Sato et al. | |
| 2003/0146691 A1 | 8/2003 | Yano et al. | |
| 2003/0178632 A1 | 9/2003 | Hohn et al. | |
| 2003/0207966 A1 * | 11/2003 | Ohtsuka et al. | 524/88 |
| 2004/0079960 A1 * | 4/2004 | Shakuda | 257/103 |
| 2005/0256234 A1 * | 11/2005 | Kurumatani et al. | 524/115 |
| 2006/0029811 A1 * | 2/2006 | Sugioka et al. | 428/413 |
| 2006/0241250 A1 | 10/2006 | Osada et al. | |

FOREIGN PATENT DOCUMENTS

| | | | |
|---|---|---|---|
| JP | 58-101143 A | 6/1983 |
| JP | 4-331253 A | 11/1992 |
| JP | 2656336 B | 5/1997 |
| JP | 2000-196151 A | 7/2000 |

(Continued)

OTHER PUBLICATIONS

Urasaki, JP 2006-140207—machine translation, Jun. 1, 2006.*

(Continued)

*Primary Examiner* — Callie Shosho
*Assistant Examiner* — Coris Fung
(74) *Attorney, Agent, or Firm* — Birch, Stewart, Kolasch & Birch, LLP

(57) ABSTRACT

A light-emitting device includes a light-emitting element on a molded part. The molded part is formed by molding and curing a thermosetting epoxy resin composition comprising (A) the reaction product of a triazine derived epoxy resin with an acid anhydride, (B) an internal parting agent having m.p. 50-90° C., (C) a reflective agent, (D) an inorganic filler, and (E) a curing catalyst.

16 Claims, 2 Drawing Sheets

(56) References Cited

FOREIGN PATENT DOCUMENTS

| | | | |
|---|---|---|---|
| JP | 2001-234032 A | | 8/2001 |
| JP | 2002-30133 A | | 1/2002 |
| JP | 2002-302533 A | | 10/2002 |
| JP | 2003-128750 A | | 5/2003 |
| JP | 2003-209286 A | | 7/2003 |
| JP | 2003-224305 A | | 8/2003 |
| JP | 2003-258223 A | | 9/2003 |
| JP | 2003-309229 A | | 10/2003 |
| JP | 2003-327794 A | | 11/2003 |
| JP | 3512732 B | | 1/2004 |
| JP | 2004-161833 A | | 6/2004 |
| JP | 2006241353 | * | 3/2005 |
| JP | 2005-159090 A | | 6/2005 |
| JP | 2005-203748 A | | 7/2005 |
| JP | 2005-259972 A | | 9/2005 |
| JP | 2005-306952 A | | 11/2005 |
| JP | 2006-140207 A | | 6/2006 |
| JP | 2006-156704 A | | 6/2006 |
| JP | 2006-193570 A | | 7/2006 |
| JP | 2006-328360 A | | 12/2006 |
| JP | 2006-328363 A | | 12/2006 |
| WO | WO 2004-099313 | * | 11/2004 |
| WO | WO 2006057172 | * | 6/2006 |

OTHER PUBLICATIONS

Chemicalland 21—Triglycidyl Isocyanurate, http://chemicalland21.com/specialtychem/perchem/TRIGLYCIDYL%20ISOCYANURATE.htm . Retrieved on Jul. 20, 2011.*
Kondo et al., JP2006-241353 machine translation, Mar. 4, 2004.*
Tipaque, http://www20.inetba.com/ishiharacorpusa/TIPAQUE.ivnu . Retrieved on Jan. 26, 2012.*
ISK—TIPAQUE CR-58. http://www.isktuas.com/titanium58.htm . Retrieved on Jan. 26, 2012.*
Naoyuki Urasaki, Thermosetting Resin Composition for Light Reflection, Substrate Made Therefrom for Photosemiconductor Element Mounting, Manufacturing Method Thereof, and Photosemiconductor Device, JP2006140207 human translation.*
Chemicalland 21—Glycerol Monostearate. Retrieved on Nov. 20, 2013. http://chemicalland21.com/lifescience/foco/GLYCEROL%20MONOSTEARATE.htm.*
NASA—"What Wavelength Goes With a Color". Retrieved on Nov. 20, 2013. http://science-edu.larc.nasa.gov/EDDOCS/Wavelengths_for_Colors.html.*
Yoshiteru Miyawaki et al., "Advanced technology relating to resin for white light LED and LED package," pp. 1-28.
Office Acton issued Nov. 14, 2012, in Japanese Patent Application No. 2047-026693.
Notification of Reason(s) for Refusal issued Jul. 23, 2013, in Japanese Patent Application No. 2007-026693, with English translation.

* cited by examiner

US 8,900,710 B2

LIGHT-EMITTING DEVICE, METHOD FOR MANUFACTURING SAME, AND MOLDED PART

CROSS-REFERENCE TO RELATED APPLICATION

This non-provisional application claims priority under 35 U.S.C. §119(a) on Patent Application No. 2007-026693 filed in Japan on Feb. 6, 2007, the entire contents of which are hereby incorporated by reference.

TECHNICAL FIELD

This invention relates to a light-emitting device for use as luminaires, displays, mobile phone backlights, moving picture illuminating auxiliary light sources, and other general commercial light sources, a method for manufacturing the same, and a molded part.

BACKGROUND ART

Surface mount light-emitting devices using light-emitting elements feature a small size, a good power efficiency, and light emission of brilliant color. The light-emitting elements eliminate the risk of lamp failures since they are semiconductor elements. They are also characterized by improved initial drive performance and resistance to vibration and repeated turn-on and off. Because of these improved properties, light-emitting devices using light-emitting elements such as light-emitting diodes (LED) and laser diodes (LD) are utilized as light sources in varying applications. Recently, light-emitting elements have marked a rapid advance toward higher outputs.

For the surface mount light-emitting devices, thermoplastic resins such as liquid crystal polymers, polyphenylene sulfide (PPS) and nylon are often used as molded parts due to ease of mass-scale production. On the other hand, epoxy resins are used in sealing members for protecting the light-emitting elements from moisture, dust and contaminants (see, for example, JP 3512732, JP-A 2001-234032, and JP-A 2002-302533). Also silicone resins are used as the output of light-emitting elements is increased.

However, prior art thermoplastic resins used as moldings in surface mount light-emitting devices are less resistant to light due to the inclusion of an aromatic component within the molecule although they are resistant to heat. Also, since hydroxyl groups or other groups for improving adhesion are absent at molecular ends, the resins exhibit poor adhesion to leads and sealing members. In particular, sealing members using silicone resins lack long-term reliability since they show a drastic drop in adhesion to molded parts using thermoplastic resins, as compared with sealing members using epoxy resins. Epoxy resins are used as sealing members, but not as molded parts in leadframe type surface mount devices because of their difficulty to mold.

Besides, light-emitting elements of gallium nitride compound semiconductor capable of blue emission produce higher outputs than light-emitting elements capable of red emission and also generate more amounts of heat. Thus, degradation of molded parts becomes a problem when light-emitting elements of blue emission are used.

Also, JP 2656336 describes an optical semiconductor device wherein an encapsulating resin is a cured product of a B-staged epoxy resin composition for optical semiconductor encapsulation comprising an epoxy resin, a curing agent, and a cure accelerator, wherein the constituent components are uniformly mixed at a molecular level. It is described that the epoxy resin used herein is typically a bisphenol A epoxy resin or bisphenol F epoxy resin, and triglycidyl isocyanate or the like may also be used. In Example, triglycidyl isocyanate is used and added in a small amount to a bisphenol type epoxy resin. As long as the present inventors have empirically studied, the B-staged epoxy resin composition for semiconductor encapsulation suffers from a problem of yellowing during long-term holding at high temperatures.

JP 2656336 describes: "The epoxy resin composition for optical semiconductor encapsulation is advantageously used as encapsulants for light-sensing elements in compact disc players, line sensors and area sensors which are solid-state image sensors. Optical semiconductor devices in which light-sensing elements such as solid-state image sensors are encapsulated with such epoxy resin compositions for optical semiconductor encapsulation are high-performance products which form images free of fringes caused by optical variations of the resin or black peppers caused by foreign particles in the encapsulating resin. Despite resin encapsulation, they exhibit at least equivalent performance to ceramic packages." It is thus understood that the encapsulating resin of this patent is used with light-sensing elements, but not for the encapsulation of light-emitting elements.

In this regard, JP-A 2000-196151, JP-A 2003-224305 and JP-A 2005-306952 refer to the use of triazine derived epoxy resins in epoxy resin compositions for the encapsulation of light-emitting elements. These epoxy resins, however, are not solid materials obtained by reacting a triazine derived epoxy resin with an acid anhydride.

Known references relating to the present invention include the foregoing as well as JP-A 2005-259972, JP-A 2006-156704, and Electronics Mount Technology, April 2004.

DISCLOSURE OF THE INVENTION

In consideration of the prior art discussed above, the inventors proposed in PCT/JP2006/314970 a light-emitting device using a molded part or package with improved heat resistance and light resistance. There is a desire to increase the efficiency of producing such molded parts.

Accordingly, an object of the invention is to provide a molded part for light-emitting devices having improved heat resistance, light resistance and productivity, a light-emitting device, and a method for manufacturing the same.

The invention relates to a light-emitting device in which a light-emitting element comprising a gallium nitride compound semiconductor having an emission peak wavelength of 430 nm or longer is rested on a molded part. The molded part uses a cured product of a thermosetting epoxy resin composition comprising the reaction product of a triazine derived epoxy resin with an acid anhydride. A light-emitting device with improved productivity as well as heat resistance and light resistance is then provided even when the light-emitting element comprising a gallium nitride compound semiconductor is used.

In one aspect, the invention provides a light-emitting device comprising a molded part comprising a thermosetting epoxy resin composition in the cured state, wherein the epoxy resin composition comprises (A) a reaction product obtained through reaction of a triazine derived epoxy resin with an acid anhydride in an epoxy group equivalent to acid anhydride group equivalent ratio from 0.6 to 2.0, (B) an internal parting agent, (C) a reflective agent, (D) an inorganic filler, and (E) a curing catalyst as essential components. The internal parting agent (B) comprises a component having the general formula (1) and a melting point in the range of 50° C. to 90° C.,

wherein $R^1$, $R^2$, and $R^3$ are each independently H, —OH, —OR or —OCOC$_a$H$_b$, at least one of $R^1$, $R^2$, and $R^3$ including —OCOC$_a$H$_b$, R is an alkyl group: C$_n$H$_{2n+1}$ wherein n is an integer of 1 to 10, "a" is an integer of 10 to 30, and "b" is an integer of 17 to 61.

The molded parts have not only improved heat resistance and light resistance, but also excellent productivity during their manufacture. Using the molded parts, the light-emitting devices can be manufactured at a high level of productivity.

The thermosetting epoxy resin composition may further comprise (F) an antioxidant. Also, the triazine derived epoxy resin is preferably a 1,3,5-triazine nucleus derived epoxy resin. The reaction product (A), which is generally in solid form, preferably comprises a compound having the general formula (2):

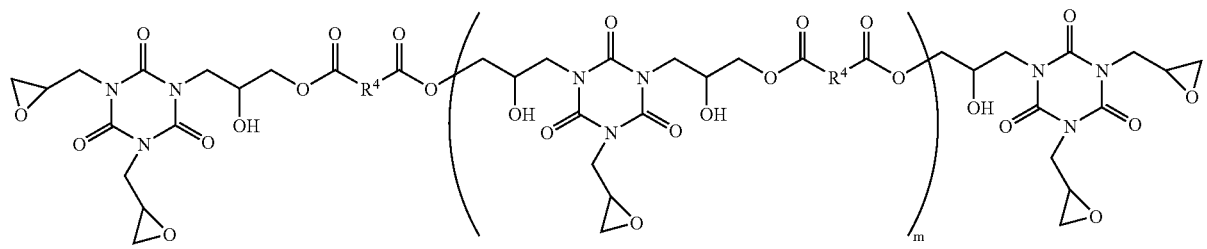

wherein $R^4$ is an acid anhydride residue and m is a number from 0 to 200.

In preferred embodiments, the internal parting agent (B) comprises glycerol monostearate having a melting point of 50 to 70° C. or a propylene glycol fatty acid ester, and is present in an amount of 0.2 to 5.0% by weight based on the total weight of the composition.

The molded part preferably has a reflectance of at least 70% at 430 nm and longer. A light-emitting device featuring a high radiation efficiency from the light-emitting element is then available.

Preferably the molded part has a recess with a bottom surface and a side surface, the light-emitting element is rested on the bottom surface of the recess, and the light-emitting element is sealed with a sealing member comprising an epoxy resin including a triazine derived epoxy resin or a silicon-containing resin. Then adhesion to the molded part is significantly improved.

In another aspect, the invention provides a method for manufacturing a light-emitting device comprising a molded part comprising a thermosetting epoxy resin composition in the cured state, the epoxy resin composition comprising (A) a reaction product obtained through reaction of a triazine derived epoxy resin with an acid anhydride in an epoxy group equivalent to acid anhydride group equivalent ratio from 0.6 to 2.0, (B) an internal parting agent, (C) a reflective agent, (D) an inorganic filler, and (E) a curing catalyst as essential components, the internal parting agent (B) comprising a component having the general formula (1) and a melting point in the range of 50° C. to 90° C. The method comprises the steps of melt mixing a triazine derived epoxy resin with an acid anhydride to form (A) the reaction product, mixing (A) the reaction product with (B) the internal parting agent, (C) the reflective agent, (D) the inorganic filler, and (E) the curing catalyst to form a thermosetting epoxy resin composition, transfer molding the thermosetting epoxy resin composition in a mold with leads disposed therein, and placing a light-emitting element, preferably having an emission peak wavelength of 430 nm or longer, on the molded part of the thermoset epoxy resin composition so that the light-emitting element may be electrically connected to the leads.

In preferred embodiments, the reaction of a triazine derived epoxy resin with an acid anhydride is effected in the presence of an antioxidant; or the reaction of a triazine derived epoxy resin with an acid anhydride is effected in the presence of a curing catalyst or a curing catalyst and an antioxidant whereby the curing catalyst is compounded as the reaction product.

With the method described above, a light-emitting device comprising a molded part comprising a thermosetting epoxy resin composition in the cured state is readily manufactured.

In a further aspect, the invention provides a molded part for use in a light-emitting device, comprising a thermosetting epoxy resin composition in the cured state. The epoxy resin composition comprises (A) a reaction product obtained through reaction of a triazine derived epoxy resin with an acid anhydride in an epoxy group equivalent to acid anhydride group equivalent ratio from 0.6 to 2.0, (B) an internal parting agent, (C) a reflective agent, (D) an inorganic filler, and (E) a curing catalyst as essential components. The internal parting agent (B) comprises a component having the general formula (1) and a melting point in the range of 50° C. to 90° C. The resultant molded part has not only improved heat resistance and light resistance, but also excellent productivity. The thermosetting epoxy resin composition may further comprise (F) an antioxidant.

BENEFITS OF THE INVENTION

The light-emitting device of the invention is improved in both heat resistance and light resistance and improved in productivity as well. The molded part on which a light-emitting element is rested is improved in curability, has a satisfactory strength, maintains heat resistance, light resistance and adhesion over a long term, and is efficiently productive. The sealing member gives a cured product which is uniform and generates little variation in color.

DESCRIPTION OF THE PREFERRED EMBODIMENT

Now, the light-emitting device, molded part, and methods for manufacturing them are described by referring to their embodiments and examples. It is understood that the invention is not limited to the embodiments and examples illustrated herein.

Figure 1:
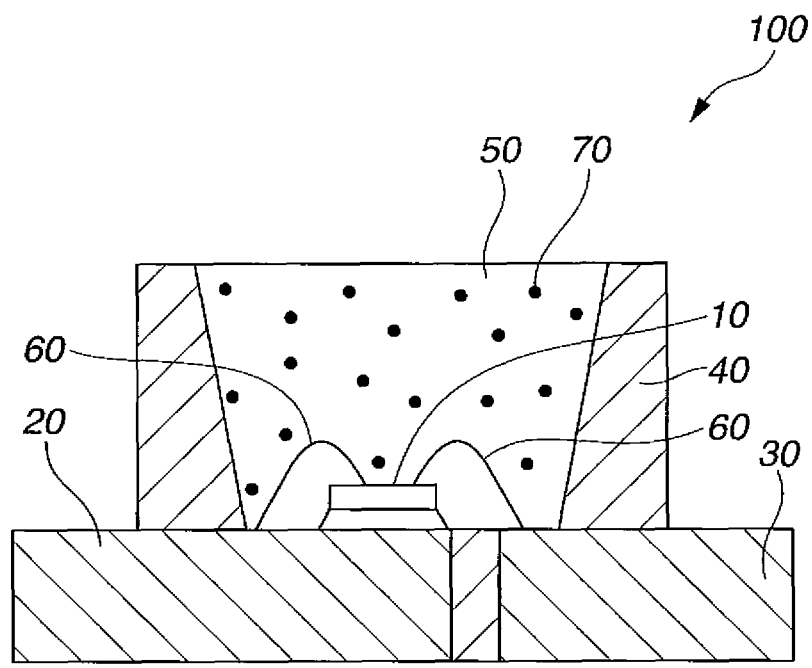
FIG. 1 is a schematic cross-sectional view of a surface mount light-emitting device according to one embodiment of the invention.
Figure 2:
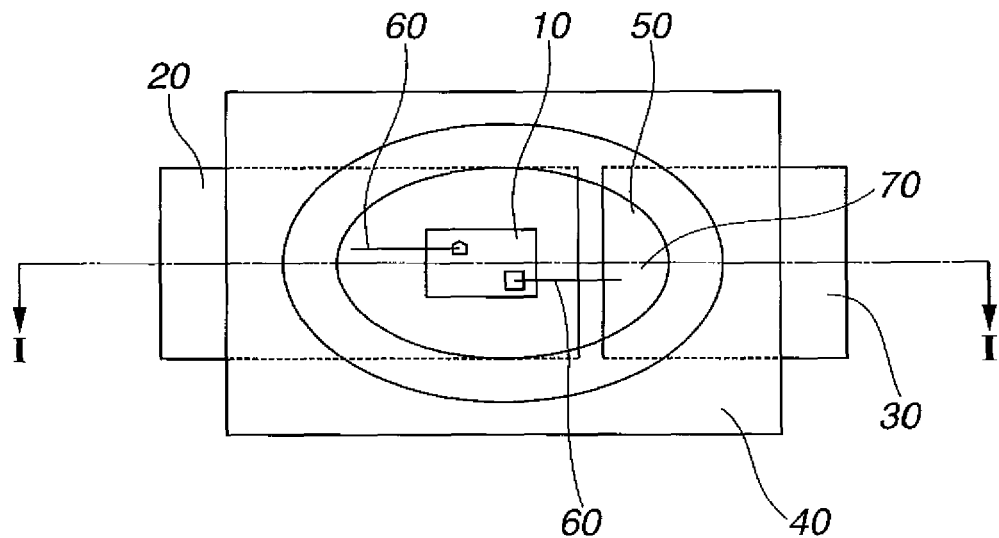
FIG. 2 is a schematic plan view of the surface mount light-emitting device of FIG. 1.

Referring to the figures, a surface mount light-emitting device according to one embodiment of the invention is described. FIG. 1 is a schematic cross-sectional view of a surface mount light-emitting device according to one embodiment of the invention. FIG. 2 is a schematic plan view of the surface mount light-emitting device of this embodiment. FIG. 1 is a cross-sectional view taken along lines I-I in FIG. 2.

The light-emitting device 100 comprises a light-emitting element 10 comprising a gallium nitride compound semiconductor having an emission peak wavelength of 430 nm or longer, and a molded part 40 on which the light-emitting element 10 is rested. The molded part 40 preferably uses a cured product of a thermosetting epoxy resin composition as defined herein and illustrated below in detail. The molded part 40 has first and second leads 20 and 30 incorporated therewith. The molded part 40 has a recess with a bottom surface and a side surface, and the light-emitting element 10 is rested on the bottom surface of the recess. The light-emitting element 10 has a pair of positive and negative electrodes, which are electrically connected to the first and second leads 20 and 30 via wire segments 60. The light-emitting element 10 is encapsulated with a sealing member 50. The sealing member 50 is preferably formed of an epoxy resin including a triazine derived epoxy resin or a silicon-containing resin selected from among flexible and rigid silicone resins, a rigid silicone resin, an epoxy-modified silicone resin, a modified silicone resin alone or a mixture of two or more because adhesion to the molded part 40 is then enhanced. Notably, encapsulation with another epoxy resin or urethane resin is possible. The sealing member 50 contains a phosphor 70 for converting the wavelength of emission from the light-emitting element 10. The molded recessed part 40 prepared using a mold or the like has such a high reflectance as to reduce the transmission of light into the bottom and side surfaces of the recess in the molded part 40 and to increase the release of light toward the front surface (top in FIG. 1).

The molded part 40 is selected to have a high reflection efficiency at 430 nm or longer since the light-emitting element 10 used has an emission peak wavelength of 430 nm or longer. Then the majority of light emitted by the light-emitting element 10 is not absorbed in the molded part 40, but released to the exterior, leading to a high radiant efficiency from the light-emitting element 10. Inversely, if a molded part 40 having a low reflectance is used, the majority of light emitted by the light-emitting element 10 is absorbed in the molded part 40, whereby degradation of the molded part 40 is accelerated.

Molded Part

The molded part 40 used herein is a cured product of a thermosetting epoxy resin composition comprising (A) a reaction product obtained through reaction of a triazine derived epoxy resin with an acid anhydride in an epoxy group equivalent to acid anhydride group equivalent ratio from 0.6 to 2.0, (B) an internal parting agent, (C) a reflective agent, (D) an inorganic filler, and (E) a curing catalyst as essential components, and preferably (F) an antioxidant. The respective components are described below.

A. Reaction Product

The thermosetting epoxy resin composition according to the invention uses as a resin component a reaction product which is obtained by mixing (A-1) a triazine derived epoxy resin with (A-2) an acid anhydride in a ratio of epoxy group equivalent to acid anhydride group equivalent of 0.6:1 to 2.0:1, and reacting them.

(A-1) Triazine Derived Epoxy Resin

The triazine derived epoxy resin (A-1) used herein is such that when a reaction product obtained through reaction thereof with an acid anhydride in a specific proportion is formulated as a resin component, the resulting thermosetting epoxy resin composition undergoes little yellowing and is thus suitable for encapsulation to fabricate a semiconductor device which is subject to little degradation with time. The preferred triazine derived epoxy resins include 1,3,5-triazine nucleus derived epoxy resins. Epoxy resins having isocyanurate rings have better light resistance and electrical insulation, with those having a two, and more preferably three epoxy groups on one isocyanurate ring being desirable. Useful examples include tris(2,3-epoxypropyl)isocyanurate, tris($\alpha$-methylglycidyl)isocyanurate, and tris($\alpha$-methylglycidyl)isocyanurate.

The triazine derived epoxy resins used herein preferably have a softening point of 90 to 125° C. It is noted that the triazine derived epoxy resins used herein exclude hydrogenated triazine rings.

(A-2) Acid Anhydride

The acid anhydride (A-2) used herein serves as a curing agent. For light resistance, acid anhydrides which are non-aromatic and free of a carbon-carbon double bond are preferred. Examples include hexahydrophthalic anhydride, methylhexahydrophthalic anhydride, trialkyltetrahydrophthalic anhydrides, and hydrogenated methylnadic anhydride, with methylhexahydrophthalic anhydride being most preferred. These acid anhydride curing agents may be used alone or in admixture.

The acid anhydride curing agent is used in such amounts that 0.6 to 2.0 equivalents, preferably 1.0 to 2.0 equivalents, more preferably 1.2 to 1.6 equivalents of epoxy groups in the triazine derived epoxy resin (A) are available per equivalent of acid anhydride groups. If the ratio of epoxy group equivalent to acid anhydride group equivalent is less than 0.6, there may occur under-cure and a loss of reliability. If the ratio is more than 2.0, the unreacted curing agent may be left in the cured composition, detracting from the moisture resistance thereof.

In the practice of the invention, components (A-1) and (A-2), preferably components (A-1), (A-2) and an antioxidant, to be described later, are previously heated for reaction at a temperature of 70 to 120° C., preferably 80 to 110° C., for 4 to 20 hours, preferably 6 to 15 hours, or components (A-1), (A-2) and a curing catalyst, to be described later, preferably components (A-1), (A-2), an antioxidant and a curing catalyst, to be described later, are previously heated for reaction at a temperature of 30 to 80° C., preferably 40 to 60° C., for 10 to 72 hours, preferably 36 to 60 hours, forming a solid reaction product having a softening point of 50 to 100° C., preferably 60 to 90° C. The solid reaction product is then ground before formulating. A reaction product having a softening point of less than 50° C. does not become solid whereas a reaction product having a softening point of higher than 100° C. may lose fluidity. Too short a reaction time may yield a reaction product which does not become solid due to less contents of high molecular weight fractions whereas too long a reaction time may detract from fluidity. It is noted that the "softening point" as used herein is measured by the ring and ball method of the JIS standard.

The (solid) reaction product obtained herein, that is, the reaction product of triazine derived epoxy resin (A-1) and acid anhydride (A-2) is preferably such that when the reaction product is analyzed by gel permeation chromatography (GPC) under conditions including a sample concentration 0.2 wt %, a feed volume 50 μl, a mobile phase THF 100%, a flow rate 1.0 ml/min, a temperature 40° C., and a detector RI, it contains 20 to 70% by weight of a high molecular weight fraction with a molecular weight of more than 1,500, 10 to 60% by weight of a moderate molecular weight fraction with a molecular weight of 300-1,500, and 10 to 40% by weight of a monomeric fraction.

The reaction product contains a reaction product having the formula (2) when component (A-1) used is triglycidyl isocyanate, and more specifically, a reaction product having the formula (3) when component (A-1) used is triglycidyl isocyanate and component (A-2) used is methylhexahydrophthalic anhydride.

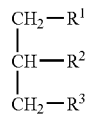

(1)

Herein $R^1$, $R^2$, and $R^3$ are each independently H, —OH, —OR or —OCOC$_a$H$_b$, at least one of $R^1$, $R^2$, and $R^3$ includes —OCOC$_a$H$_b$, R is an alkyl group: C$_n$H$_{2n+1}$ wherein n is an integer of 1 to 10, "a" is an integer of 10 to 30, and "b" is an integer of 17 to 61.

The internal parting agent (B) may be added in an amount of 0.2 to 5.0% by weight based on the total weight of the composition.

Known internal parting agents include natural waxes such as carnauba wax, and synthetic waxes such as acid waxes, polyethylene waxes, and fatty acid waxes. When exposed to high temperatures or light, most parting agents are prone to yellowing and are degraded with time, eventually losing parting properties. Among these, the internal parting agents having formula (1) are unsusceptible to yellowing when exposed

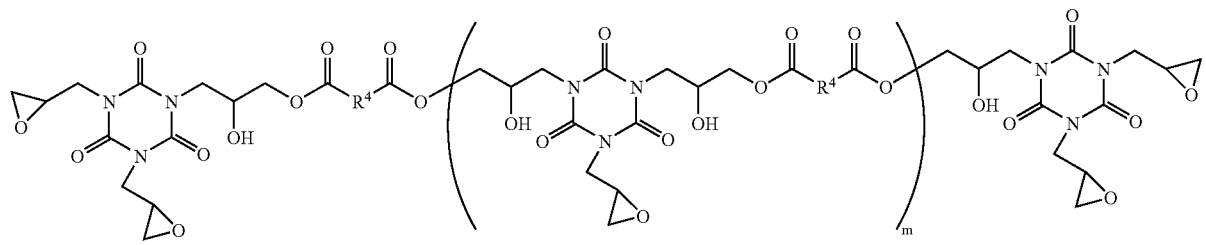

(2)

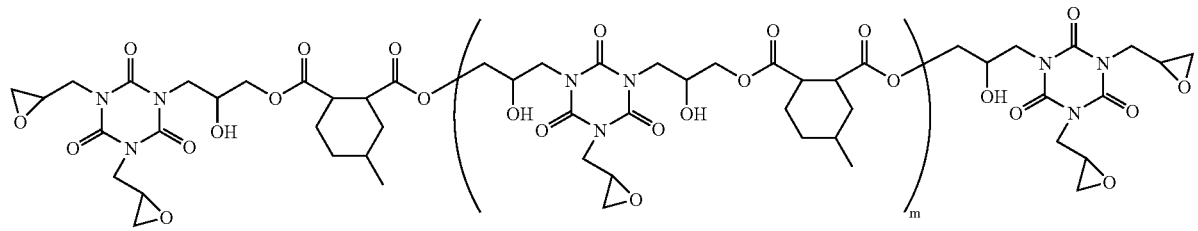

(3)

Herein, $R^4$ is an acid anhydride residue and m is a number of 0 to 200 and preferably 0 to 100. These reaction products have an average molecular weight of 500 to 100,000.

As previously described, the reaction product preferably contains 20 to 70%, especially 30 to 60% by weight of a high molecular weight fraction with a molecular weight of more than 1,500, 10 to 60%, especially 10 to 40% by weight of a moderate molecular weight fraction with a molecular weight of 300-1,500, and 10 to 40%, especially 15 to 30% by weight of a monomeric fraction (unreacted epoxy resin and acid anhydride).

B. Internal Parting Agent

In the epoxy resin composition, (B) an internal parting agent is compounded for facilitating mold release of the composition upon molding. The internal parting agent (B) comprises a compound having the general formula (1) and a melting point in the range of 50° C. to 90° C.

to high temperatures or light, and maintain satisfactory parting properties over a long period of time.

In formula (1), at least one of $R^1$, $R^2$, and $R^3$ should be —OCOC$_a$H$_b$. Although the compound of formula (1) wherein all $R^1$, $R^2$, and $R^3$ are —OH fails to provide the composition with parting properties and heat resistance, compounds having —OCOC$_a$H$_b$ incorporated in their structure provide for good compatibility, heat resistance and parting properties.

In the formula: —OCOC$_a$H$_b$, "a" is an integer of 10 to 30, and preferably 11 to 20. If "a" is less than 10, then thermal yellowing resistance may be insufficient. If "a" is more than 30, the compound may fail to provide for compatibility and parting effect. The moiety C$_a$H$_b$ may be a saturated or unsaturated aliphatic hydrocarbon moiety. In the case of unsaturation, inclusion of one or two unsaturated groups is preferred. Preference is then given to b=2a+1, 2a−1 and 2a−3, and especially b=2a+1 and 2a−1. This suggests that "b" is an integer of 17 to 61 and preferably 19 to 41. More preferably, "b" is an integer of 21 to 61 and especially 23 to 41.

Examples of suitable internal parting agents include glycerol monopalmitate, glycerol monostearate, glycerol mono (12-hydroxystearate), glycerol tri(12-hydroxystearate), glycerol monobehenate, propylene glycol monopalmitate, propylene glycol monostearate, and propylene glycol monobehenate.

In order for these compounds to have heat resistant properties, their melting point and volatile matter at high temperatures are also significant. In this regard, a melting point of 50 to 90° C., and preferably 65 to 85° C. is recommended. The volatile content at 250° C. should preferably be up to 10% by weight. If the melting point is less than 50° C., satisfactory thermal yellowing resistance may not be obtained. If the melting point is above 90° C., the compound may fail to provide for compatibility and parting effect. From the aspects of dispersion and compatibility, glycerol monostearate having a melting point of 50 to 70° C. is especially preferred. Similarly, propylene glycol fatty acid esters are preferred.

It is noted that the parting agent of formula (1) should preferably account for 20 to 100%, and more preferably 50 to 100% by weight of the entire internal parting agent (R). The remainder of the parting agent may include natural waxes, acid waxes and other synthetic waxes as described above.

The internal parting agent (B) is preferably added in an amount of 0.2 to 5.0% by weight, and more preferably 0.5 to 3.0% by weight based on the total weight of the composition. An addition amount of less than 0.2 wt % may fail to provide for parting properties whereas an amount of more than 5.0 wt % may cause such defectives as bleeding and poor adhesion.

C. Reflective Agent

In the epoxy resin composition, (C) a reflective agent is compounded. It serves as a white colorant for enhancing whiteness. The preferred reflective agent is titanium dioxide. Titanium dioxide has a unit lattice which may be rutile, anatase or brookite type. It is not limited in average particle size and shape although the average particle size is generally in a range of 0.05 to 5.0 µm. The titanium dioxide may be previously surface treated with hydrous oxides of aluminum, silicon or the like for enhancing its compatibility with and dispersibility in resins and inorganic fillers. While titanium dioxide is the preferred reflective agent or white colorant, potassium titanate, zirconium oxide, zinc sulfide, zinc oxide, magnesium oxide or the like may also be used alone or in combination with titanium dioxide as the reflective agent.

An amount of the reflective agent loaded is preferably 2 to 80% by weight and more preferably 5 to 50% by weight of the entire composition. Less than 2% by weight may fail to achieve a sufficient whiteness whereas more than 80% by weight may adversely affect molding operation, leaving unfilled or void defects.

D. Inorganic Filler

In the epoxy resin composition, (D) an inorganic filler is compounded. For the inorganic filler (D), any of fillers which are commonly compounded in epoxy resin compositions may be used. Examples include silicas such as fused silica and crystalline silica, alumina, silicon nitride, aluminum nitride, boron nitride, glass fibers, and antimony trioxide although the reflective agent or white colorant described above as component (C) should be excluded.

These inorganic fillers are not particularly limited in average particle size and shape. They generally have an average particle size of 5 to 40 µm. It is noted that the average particle size can be determined as the weight average value $D_{50}$ or median diameter in particle size distribution measurement by the laser light diffraction technique.

The inorganic filler which has been surface treated with coupling agents such as silane coupling agents and titanate coupling agents may be compounded for enhancing the bond strength between the resin and the inorganic filler. Suitable and preferable coupling agents include, for example, epoxy functional alkoxysilanes such as γ-glycidoxypropyltrimethoxysilane, γ-glycidoxypropylmethyldiethoxysilane, and β-(3,4-epoxycyclohexyl)ethyltrimethoxysilane, amino functional alkoxysilanes such as N-β-(aminoethyl)-γ-aminopropyltrimethoxysilane, γ-aminopropyltriethoxysilane, and N-phenyl-γ-aminopropyltrimethoxysilane, and mercapto functional alkoxysilanes such as γ-mercaptopropyltrimethoxysilane. It is understood that the amount of the coupling agent used for surface treatment and the surface treatment technique are not particularly limited.

An amount of the inorganic filler loaded is preferably 20 to 700 parts by weight and more preferably 50 to 400 parts by weight per 100 parts by weight of the epoxy resin (A-1) and the acid anhydride (A-2) combined. Less than 20 pbw may fail to achieve a sufficient strength whereas more than 700 pbw may result in unfilled defects due to a viscosity buildup and failures such as separation within the device or package due to a loss of flexibility. The inorganic filler is preferably contained in an amount of 10 to 90% by weight and more preferably 20 to 80% by weight based on the entire composition.

E. Curing Catalyst

The curing catalyst (E) used herein may be any of well-known curing catalysts which are commonly used in epoxy resin compositions of this type. Suitable catalysts include, but are not limited to, tertiary amines, imidazoles, organic carboxylic acid salts of amines and imidazoles, metal salts of organic carboxylic acids, metal-organic compound chelates, aromatic sulfonium salts, phosphorus-based catalysts such as organic phosphine compounds and phosphonium compounds, and salts of the foregoing, which may be used alone or in admixture. Of these, the imidazoles and phosphorus-based catalysts are preferred. More preferred are 2-ethyl-4-methylimidazole, methyltributylphosphonium dimethylphosphate, and quaternary phosphonium bromides.

The curing catalyst is preferably used in an amount of 0.05 to 5%, more preferably 0.1 to 2% by weight based on the entire composition. Outside the range, the resulting epoxy resin composition may have an undesired profile of heat resistance and moisture resistance.

F. Antioxidant

In the epoxy resin composition, (F) an antioxidant is compounded if necessary. The antioxidant (F) used herein is typically selected from among phenolic, phosphorus-based and sulfur-based antioxidants.

Examples of suitable phenolic antioxidants include 2,6-di-t-butyl-p-cresol, butylated hydroxyanisole, 2,6-di-t-butyl-p-ethylphenol, stearyl-β-(3,5-di-t-butyl-4-hydroxyphenyl)propionate, 2,2'-methylenebis(4-methyl-6-t-butylphenol), 4,4'-butylidene bis(3-methyl-6-t-butylphenol), 3,9-bis[1,1-dimethyl-2-{β-(3-t-butyl-4-hydroxy-5-methyl-phenyl)propionyloxy}ethyl]-2,4,8,10-tetraoxaspiro[5,5]-undecane, 1,1,3-tris(2-methyl-4-hydroxy-5-t-butylphenyl)butane, and 1,3,5-trimethyl-2,4,6-tris(3,5-di-t-butyl-4-hydroxybenzyl)-benzene. Inter alia, 2,6-di-t-butyl-p-cresol is preferred.

Examples of suitable phosphorus-based antioxidants include triphenyl phosphate, diphenylalkyl phosphates, phenyldialkyl phosphates, tri(nonylphenyl)phosphite, trilauryl phosphite, trioctadecyl phosphite, distearyl pentaerythritol diphosphite, tris(2,4-di-tert-butylphenyl)phosphate, diisodecyl pentaerythritol diphosphite, di(2,4-di-tert-butylphenyl) pentaerythritol diphosphite, tristearyl sorbitol triphosphite, and tetrakis(2,4-di-tert-butylphenyl)-4,4'-biphenyl diphosphonate. Inter alia, triphenyl phosphite is preferred.

Examples of suitable sulfur-based antioxidants include dilauryl 3,3'-thiodipropionate, dimyristyl 3,3'-thiodipropionate, and distearyl 3,3'-thiodipropionate.

These antioxidants may be used alone or in admixture. It is especially preferred to use a phosphorus-based antioxidant alone or in combination with a phenolic antioxidant. When a mixture of a phenolic antioxidant and a phosphorus-based antioxidant is used, the phenolic antioxidant and the phosphorus-based antioxidant are preferably mixed in a weight ratio from 0:100 to 70:30, more preferably from 0:100 to 50:50.

The antioxidant is preferably used in an amount of 0.01 to 10% by weight, more preferably 0.03 to 5% by weight based on the epoxy resin composition. Outside the range, less amounts of the antioxidant may provide epoxy resin compositions which are less heat resistant or susceptible to discoloration whereas too much amounts may interfere with the cure, inviting losses of curability and strength.

G. Other Epoxy Resins

If necessary, epoxy resins other than component (A-1) may be used in a limited amount as long as the objects of the invention are not compromised. Specifically, the amount of other epoxy resin added is 0 to 40 parts by weight, and more specifically 5 to 20 parts by weight per 100 parts by weight of component (A-1). Suitable other epoxy resins include bisphenol A epoxy resins, bisphenol F epoxy resins, biphenol type epoxy resins such as 3,3',5,5'-tetramethyl-4,4'-biphenol epoxy resins and 4,4'-biphenol epoxy resins, phenol novolac type epoxy resins, cresol novolac type epoxy resins, bisphenol A novolac type epoxy resins, naphthalene diol epoxy resins, trisphenylol methane epoxy resins, tetrakisphenylol ethane epoxy resins, and phenol dicyclopentadiene novolac type epoxy resins in which aromatic rings are hydrogenated. The other epoxy resins should preferably have a softening point of 70 to 100° C.

Other Additives

Various other additives may be incorporated in the epoxy resin composition, if necessary. For example, thermoplastic resins, thermoplastic elastomers, organic synthetic rubbers, stress-reducing agents (e.g., silicone-based agents), halogen-trapping agents, and the like may be added for improving selected properties as long as the objects of the invention are not compromised.

Preparation of Epoxy Resin Composition

The epoxy resin composition of the invention is prepared as a molding compound by previously combining components (A-1) and (A-2), preferably components (A-1), (A-2) and (F), and uniformly melt mixing them at a temperature of 70 to 120° C., preferably 80 to 110° C. in a reactor such as a solventless system equipped with a heater, or by previously combining components (A-1), (A-2) and (E), preferably components (A-1), (A-2), (E) and (F), and uniformly melt mixing them at a temperature of 30 to 80° C., preferably 40 to 60° C. in a reactor such as a solventless system equipped with a heater. In the course of heating, the reaction mixture builds up its viscosity. The course continues until the mixture has a softening point sufficient to handle at room temperature, specifically a softening point of 50 to 100° C., preferably 60 to 90° C. The reaction mixture is then cooled whereupon it becomes solid.

The temperature range at which components are mixed is from 70° C. to 120° C., preferably from 80° C. to 110° C. when components (A-1) and (A-2), preferably components (A-1), (A-2) and (F) are combined together. Temperatures below 70° C. are too low to produce a mixture which becomes solid at room temperature. Temperatures above 120° C. provide too high a reaction rate, making it difficult to stop the reaction at the desired degree of reaction. The temperature range at which components (A-1), (A-2) and (E) or components (A-1), (A-2), (E) and (F) are mixed is from 30° C. to 80° C., preferably from 40° C. to 60° C. while the problems associated with lower or higher temperatures are the same as described above.

The solid reaction product is then ground and if necessary, combined with components (B), (C), (D) as well as (E) and optional (F) if components (E) and (F) have not been used in the preparation of the solid reaction product, and other additives in accordance with a predetermined recipe. This is intimately mixed on a mixer or the like, melt mixed on a hot roll mill, kneader or extruder, cooled for solidification again, and ground to a suitable size whereupon the ground material is ready for use as a molding compound of epoxy resin composition.

The epoxy resin composition thus obtained has a white color and is advantageously used as molded parts or housings for semiconductor and electronic devices and equipment, especially having light-emitting elements incorporated therein, or as encapsulants for light-emitting elements and other semiconductor devices, with the proviso that light-receiving elements and integral members having light-emitting and receiving members combined such as photocouplers are excluded.

The method of molding the thermosetting epoxy resin composition is most often low-pressure transfer molding. The epoxy resin composition of the invention is desirably molded at a temperature of 150 to 185° C. for 30 to 180 seconds and post-cured at a temperature of 150 to 185° C. for 2 to 20 hours.

Light-Emitting Element

The light-emitting element 10 in FIGS. 1 and 2 should have an emission peak wavelength of 430 nm or longer because the molded part 40 exhibits a high reflectance and possesses light resistance at or above that wavelength. Use of a gallium nitride compound semiconductor is particularly preferred. A light-emitting device of the prior art construction that a light-emitting element comprising a gallium nitride compound semiconductor is rested on a molded part of PPS has the problem that the molded part can be degraded by the heat release from the light-emitting element because the light-emitting elements of gallium nitride compound semiconductor produce more amounts of heat upon electric current conduction than light-emitting elements of GaP, GaAs or the like. The light-emitting element 10 of gallium nitride compound semiconductor used herein is prepared by depositing a semiconductor such as GaN, InGaN, or InAlGaN on a substrate to form a light-emitting layer.

Sealing Member

The sealing member 50 is preferably formed using an epoxy resin including a triazine derived epoxy resin or a silicon-containing resin as typified by a silicone resin.

The sealing member 50 using an epoxy resin including a triazine derived epoxy resin offers enhanced adhesion since it is of the same material system as the molded part 40. The epoxy resin used herein may be the reaction product of a triazine derived epoxy resin with an acid anhydride in an epoxy group equivalent to acid anhydride group equivalent ratio from 0.6 to 2.0. Since the light-emitting element 10 of gallium nitride compound semiconductor reaches a temperature of 100° C. or above upon electric current conduction, both the sealing member 50 and the molded part 40 are thermally expanded, though to a slight extent. When the sealing member 50 and the molded part 40 are formed of materials of the same system, they have approximate coefficients of thermal expansion so that little separation occurs at the interface between the sealing member 50 and the molded part 40.

While most sealing members using silicon-containing resins tend to be less adherent to prior art molded parts using thermoplastic resins, their adhesion can be increased when the molded part 40 is made of the epoxy resin composition of the invention, from which the internal parting agent (B) may be eliminated. Since the light-emitting element 10 of gallium nitride compound semiconductor emits blue light having a high level of emission energy upon electric current application, the sealing member in close contact with the light-emitting element 10 is most prone to degradation. The rate of degradation can be minimized by forming the sealing member from silicon-containing resins, typically silicone resins. Similarly, although the surface of the molded part 40, that is, its adhesion interface to the sealing member 50 is also degraded by light and has a likelihood of separation, the adhesion interface between the sealing member of light resistant silicon-containing resin and the molded part of the inventive epoxy resin composition is least prone to failure.

Phosphor

The phosphor 70 may be any of compounds which absorb light from the light-emitting element 10 and wavelength convert it into light of a different wavelength. Use may be made of, for example, rare earth based aluminate salt phosphors activated mainly with a lanthanoid element like Ce, such as represented by $Y_3Al_5O_{12}$:Ce, $(Y,Gd)_3Al_5O_{12}$:Ce, and $Y_3(Al,Ga)_5O_{12}$:Ce.

EXAMPLE

Examples and Comparative Examples are given below for further illustrating the invention although the invention is not limited to these Examples.

Examples 1-10 and Comparative Examples 1-8

White epoxy resin compositions were prepared according to the formulation shown in Tables 2 and 3, specifically by previously melt mixing an epoxy resin, an acid anhydride and an antioxidant in a reactor at 100° C. for 3 hours, cooling the reaction mixture for solidification (softening point 60° C.), grinding the reaction product, combining it with the remaining components, uniformly melt mixing on a hot two-roll mill, cooling and grinding. The compositions were ready for use in forming molded parts for light-emitting devices. The ingredients used herein are listed below.

A-1. Epoxy resin
  Triazine derived epoxy resin:
    tris(2,3-epoxypropyl)isocyanate,
    TEPIC-S by Nissan Chemical Industries, Ltd.,
    epoxy equivalent 100
A-2. Acid anhydride
  Carbon-carbon double bond-free acid anhydride:
    methylhexahydrophthalic anhydride,
    Rikacid M H by New Japan Chemical Co., Ltd.
B. Internal parting agent
  B-1: glycerol monostearate,
    H-100 by Riken Vitamin Co., Ltd.
  B-2: propylene glycol monobehenate,
    PB-100 by Riken Vitamin Co., Ltd.
  B-3: glycerol tri(12-hydroxystearate),
    TG-12 by Riken Vitamin Co., Ltd.
  B-4: polyethylene wax,
    PE-190 by Clariant Japan
  B-5: oxidized polyethylene wax,
    H-22 by Clariant Japan
  B-6: acid wax,
    stearic acid by Wako Pure Chemical Industries, Ltd.

TABLE 1

| Internal parting agent | | Melting point (° C.) | Appearance | Yellowing resistance @ 180° C./24 hr |
|---|---|---|---|---|
| B-1 | glycerol monostearate | H-100 | 68 | White | Transparent |
| B-2 | propylene glycol monobehenate | PB-100 | 56 | White | Transparent |
| B-3 | glycerol tri(12-hydroxystearate) | TG-12 | 85 | White | Transparent |
| B-4 | polyethylene wax | PE-190 | 135 | White | Transparent |
| B-5 | oxidized polyethylene wax | H-22 | 105 | White | Faintly yellow |
| B-6 | acid wax | Stearic acid | 70 | White | Faintly yellow |

Note that thermal yellowing resistance was examined by placing 10 g of an internal parting agent in an aluminum dish, holding the sample at 180° C. for 24 hours, and measuring the yellowness of the sample.

C. Reflective agent
  Titanium dioxide of rutile type,
    Tipaque CR-90 by Ishihara Sangyo Kaisha, Ltd.
D. Inorganic filler
  ground fused silica by Tatsumori Co., Ltd.
E. Curing catalyst
  E-1: Phosphorus-based curing catalyst:
    methyltributylphosphonium dimethylphosphate,
    PX-4MP by Nippon Chemical Industrial Co., Ltd.
  E-2: Imidazole catalyst:
    2-ethyl-4-methylimidazole,
    2E4MZ by Shikoku Chemicals Corp.
F. Antioxidant
  F-1: Phosphorus-based antioxidant:
    triphenyl phosphite
    by Wako Pure Chemical Industries, Ltd.
  F-2: Phenolic antioxidant;
    2,6-di-t-butyl-p-cresol,
    BHT by Wako Pure Chemical Industries, Ltd.
G. Other epoxy resin
  G-1; Hydrogenated bisphenol A epoxy resin,
    YL-7170 by Japan Epoxy Resin Co., Ltd.,
    epoxy equivalent 1,200
  G-2: Hydrogenated biphenyl epoxy resin,
    YL-7040 by Japan Epoxy Resin Co., Ltd.,
    epoxy equivalent 220

G-3: Bisphenol A epoxy resin,
  E1004 by Japan Epoxy Resin Co., Ltd.,
  epoxy equivalent 890
H. Other curing agent
  H-1: Carbon-carbon double bond-containing acid anhydride:
    tetrahydrophthalic anhydride,
    Rikacid T H by New Japan Chemical Co., Ltd.
  H-2: Phenol novolac resin,
    TD-2131 by Dainippon Ink & Chemicals, Inc.

These compositions were examined for the following properties, with the results shown in Tables 2 and 3.

Spiral Flow

Using a mold according to EMMI standards, a spiral flow was measured at 175° C. and 6.9 N/mm² for a molding time of 120 seconds.

Melt Viscosity

Using a constant-load orifice type flow tester with a nozzle having a diameter of 1 mm, a viscosity was measured at a temperature of 175° C. and a load of 10 kgf.

Flexural Strength

Using a mold according to EMMI standards, a specimen was molded at 175° C. and 6.9 N/mm² for 120 seconds. It was measured for flexural strength according to JIS K6911.

Heat Resistance or Yellowing

A disk having a diameter of 50 mm and a thickness of 3 mm was molded at 175° C. and 6.9 N/mm² for a molding time of 2 minutes and allowed to stand at 180° C. for 24 hours, after which a yellowness index was measured.

Continuous Molding

Continuous molding was rated in terms of the number of shots. One shot consists of feeding a plurality of tablets of the epoxy resin composition into a pot, and forcing a plunger to inject the melt into a mold cavity to form a molded part of the cured epoxy resin composition. If the epoxy resin composition has a high viscosity, then some material is left on the plunger and the like to clog the port eventually so that molding operation is no longer continued. A more number of shots represents better continuous molding.

TABLE 2

| Formulation (pbw) | | Example 1 | 2 | 3 | 4 | 5 | 6 | Comparative Example 1 | 2 | 3 |
|---|---|---|---|---|---|---|---|---|---|---|
| Epoxy resin | (A-1) | 9 | 9 | 9 | 9 | 9 | 9 | 9 | 9 | 9 |
| | (G-1) | | | | | | | | | |
| | (G-2) | | | | | | | | | |
| | (G-3) | | | | | | | | | |
| Curing agent | (A-2) | 14 | 14 | 14 | 14 | 14 | 14 | 14 | 14 | 14 |
| | (H-1) | | | | | | | | | |
| | (H-2) | | | | | | | | | |
| Antioxidant | (F-1) | 0.1 | 0.1 | 0.1 | 0.1 | 0.1 | | 0.1 | 0.1 | 0.1 |
| | (F-2) | | | | | | | | | |
| Premixing of epoxy resin + curing agent + antioxidant | | Yes | Yes | Yes | Yes | Yes | Yes | Yes | Yes | Yes |
| Internal parting agent | (B-1) | 1 | 2 | | | 1 | 1 | | | |
| | (B-2) | | | 2 | | | | | | |
| | (B-3) | | | | 2 | | | | | |
| | (B-4) | | | | | | | 2 | | |
| | (B-5) | | | | | | | | 2 | |
| | (B-6) | | | | | | | | | 2 |
| Titanium dioxide | (C) | 6 | 6 | 6 | 6 | 6 | 6 | 6 | 6 | 6 |
| Inorganic filler | (D) | 70 | 70 | 70 | 70 | 70 | 70 | 70 | 70 | 70 |
| Curing catalyst | (E-1) | | | | | | | | | |
| | (E-2) | 0.1 | 0.1 | 0.1 | 0.1 | 0.1 | 0.1 | 0.1 | 0.1 | 0.1 |
| Test results | Spiral flow, inch | 15 | 15 | 15 | 15 | 15 | 15 | 12 | 13 | 13 |
| | Melt viscosity, Pa·s | 80 | 80 | 80 | 80 | 80 | 80 | 100 | 95 | 95 |
| | Flexural strength, N/mm² | 100 | 100 | 100 | 100 | 100 | 100 | 100 | 95 | 95 |
| | Continuous molding, shots | 300< | 300< | 300< | 300< | 300< | 300< | 3 | 40 | 35 |
| | Heat resistance or Yellowing | white | white | white | white | white | white | pale yellow | pale yellow | pale yellow |

TABLE 3

| Formulation (pbw) | | Example 7 | 8 | 9 | 10 | Comparative Example 4 | 5 | 6 | 7 | 8 |
|---|---|---|---|---|---|---|---|---|---|---|
| Epoxy resin | (A-1) | 9 | 8 | 4 | 6 | 9 | 2 | | | |
| | (G-1) | | 3 | 11 | | | 71 | 20 | | |
| | (G-2) | | | | 6 | | | | | |
| | (G-3) | | | | | | | | 20 | 21 |
| Curing agent | (A-2) | 14 | 12 | 8 | 12 | 14 | 5 | | 3 | |
| | (H-1) | | | | | | | 3 | | |
| | (H-2) | | | | | | | | | 2 |

TABLE 3-continued

| Formulation | | Example | | | | Comparative Example | | | | |
|---|---|---|---|---|---|---|---|---|---|---|
| | (pbw) | 7 | 8 | 9 | 10 | 4 | 5 | 6 | 7 | 8 |
| Antioxidant | (F-1) | 0.1 | 0.1 | 0.1 | 0.1 | 0.1 | | 0.1 | 0.1 | 0.1 |
| | (F-2) | 0.1 | 0.1 | 0.1 | 0.1 | | | 0.1 | 0.1 | 0.1 |
| | Premixing of epoxy resin + curing agent + antioxidant | Yes | Yes | Yes | Yes | No | No | Yes | Yes | Yes |
| Internal parting agent | (B-1) | 1 | 1 | 1 | 1 | 1 | 1 | 1 | 1 | 1 |
| | (B-2) | | | | | | | | | |
| | (B-3) | | | | | | | | | |
| | (B-4) | | | | | | | | | |
| | (B-5) | | | | | | | | | |
| | (B-6) | | | | | | | | | |
| Titanium dioxide | (C) | 6 | 6 | 6 | 6 | 6 | 6 | 6 | 6 | 6 |
| Inorganic filler | (D) | 70 | 70 | 70 | 70 | 70 | 70 | 70 | 70 | 70 |
| Curing catalyst | (E-1) | 0.1 | 0.1 | 0.1 | 0.1 | | 0.1 | 0.1 | 0.1 | 0.1 |
| | (E-2) | | | | | 0.1 | | | | |
| Test results | Spiral flow, inch | 25 | 20 | 18 | 20 | 15 | 15 | 25 | 18 | 17 |
| | Melt viscosity, Pa-s | 60 | 90 | 100 | 80 | 80 | 120 | 90 | 100 | 120 |
| | Flexural strength, N/mm$^2$ | 110 | 150 | 180 | 120 | 80 | 150 | 60 | 90 | 160 |
| | Continuous molding, shots | 300< | 300< | 300< | 300< | 300< | 300< | 300< | 300< | 300< |
| | Heat resistance or Yellowing | white | white | white | white | faintly yellow | faintly yellow | yellow | yellow | pale yellow |

As seen from the results in Tables 2 and 3, Examples 1 to 10 allow for outstandingly better continuous molding than Comparative Examples 1 to 3, indicating higher productivity. In particular, Examples 1 to 10 are improved in heat resistance over Comparative Examples because they are little discolored and maintain white color. It is concluded that Examples 1 to 10 are not only highly productive, but also so heat resistant that their molded parts are not degraded.

Reflectance

Figure 3:
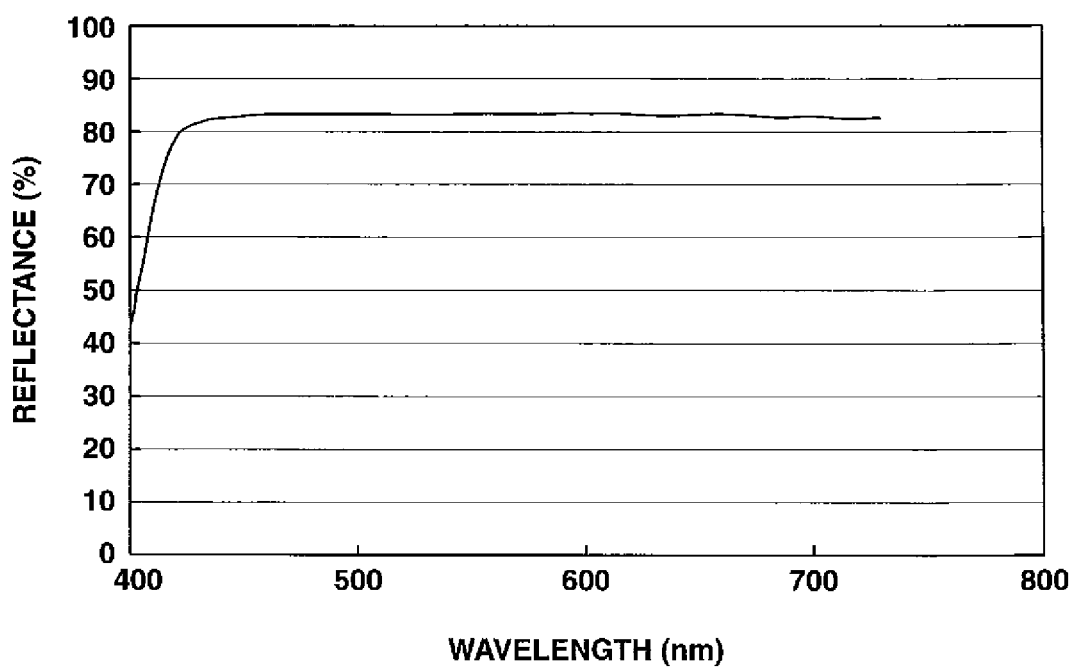
FIG. 3 is a diagram showing a reflectance of a molded part according to another embodiment of the invention.

A reflectance of the molded part was measured by irradiating light of a predetermined wavelength thereto. FIG. 3 is a diagram showing a reflectance of a molded part. It is seen that the molded part exhibits a very high reflectance to light having wavelengths of 430 nm and longer.

As is evident from the data, premixing is recommended because the resulting compositions are more resistant to yellowing and maintain higher strength.

INDUSTRIAL APPLICABILITY

The light-emitting device of the invention can be utilized as luminaires, displays, mobile phone backlights, moving picture illuminating auxiliary light sources, and other general commercial light sources.

Japanese Patent Application No. 2007-026693 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A light-emitting device comprising a light-emitting element and a molded part,
   wherein the light-emitting element comprises a gallium nitride compound semiconductor having an emission peak wavelength of 430 nm or longer;
   the molded part comprising a thermosetting epoxy resin composition in the cured state,
   the epoxy resin composition comprising (A) a reaction product obtained through reaction of a triazine derived epoxy resin with an acid anhydride in an epoxy group equivalent to acid anhydride group equivalent ratio from 0.6 to 2.0, (B) an internal parting agent, (C) a reflective agent including titanium dioxide, (D) an inorganic filler, (E) a curing catalyst, and (F) an antioxidant;
   wherein the triazine derived epoxy resin in component (A) is a 1,3,5-triazine nucleus derived epoxy resin,
   wherein the triazine derived epoxy resin, acid anhydride, and antioxidant (F) are pre-mixed to obtain the reaction product;
   wherein the internal parting agent (B) comprises glycerol monostearate having a melting point of 50 to 70° C.
   wherein the molded part forms a side surface or a bottom surface of a recess in which a light-emitting element is disposed, and the molded part has a high reflectance so as to reduce transmission of light from the light-emitting element into the surface,
   wherein the molded part has a reflectance of at least 70% at a wavelength of 430 nm or longer, and
   wherein the internal parting agent (B) is present in an amount of 0.2 to 5.0% by weight based on the total weight of the composition.

2. The light-emitting device of claim 1, wherein the reaction product (A) comprises a compound having the general formula (2):

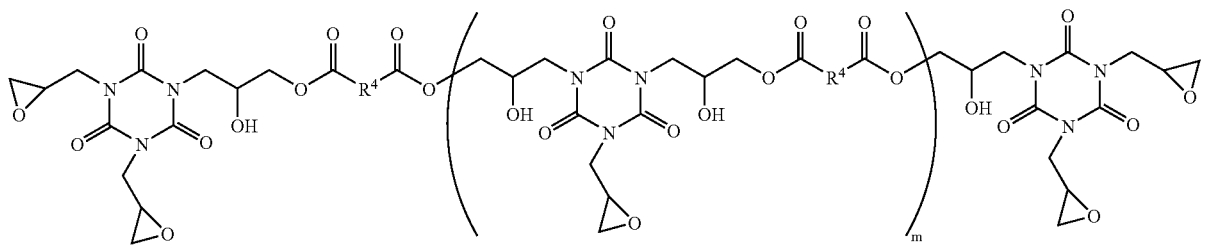

(2)

wherein $R^4$ is an acid anhydride residue and m is a number from 0 to 200.

3. The light-emitting device of claim 1, wherein an amount of the reflective agent in the epoxy resin composition is between 2 to 80% by weight.

4. The light-emitting device of claim 1, wherein an amount of the reflective agent in the epoxy resin composition is between 5 to 50% by weight.

5. The light-emitting device of claim 1, wherein the titanium dioxide in the reflective agent is surface treated with a hydrous oxide of aluminum or silicon for enhancing its compatibility with and dispersibility in the epoxy resin composition.

6. The light-emitting device of claim 1, wherein the titanium dioxide in the reflective agent has an average particle size in a range of 0.05 to 5.0 μm.

7. The light-emitting device of claim 1, wherein the titanium dioxide in the reflective agent has a unit lattice of rutile type.

8. The light-emitting device of claim 1, wherein the (F) antioxidant is phenolic, phosphorous-based or sulfur-based.

9. The light-emitting device of claim 1, wherein the (F) antioxidant is phenolic or phosphorous-based.

10. A molded part for use in a light-emitting device, comprising a thermosetting epoxy resin composition in the cured state, the epoxy resin composition comprising (A) a reaction product obtained through reaction of a triazine derived epoxy resin with an acid anhydride in an epoxy group equivalent to acid anhydride group equivalent ratio from 0.6 to 2.0, (B) an internal parting agent, (C) a reflective agent including titanium dioxide, (D) an inorganic filler, (E) a curing catalyst, and (F) an antioxidant;

wherein the triazine derived epoxy resin in component (A) is a 1,3,5-triazine nucleus derived epoxy resin, wherein the triazine derived epoxy resin, acid anhydride, and antioxidant (F) are pre-mixed to obtain the reaction product, wherein the internal parting agent (B) comprises glycerol monostearate having a melting point of 50 to 70° C. and is present in an amount of 0.2 to 5.0% by weight based on the total weight of the composition, wherein the molded part forms a side surface or a bottom surface of a recess in which a light-emitting element is disposed, and the molded part has a high reflectance so as to reduce transmission of light from the light-emitting element into the surface, and wherein the molded part has a reflectance of at least 70% at a wavelength of 430 nm or longer.

11. The molded part of claim 10, wherein an amount of the reflective agent in the epoxy resin composition is between 2 to 80% by weight.

12. The molded part of claim 10, wherein an amount of the reflective agent in the epoxy resin composition is between 5 to 50% by weight.

13. The molded part of claim 10, wherein the titanium dioxide in the reflective agent is surface treated with a hydrous oxide of aluminum or silicon for enhancing its compatibility with and dispersibility in the epoxy resin composition.

14. The molded part of claim 10, wherein the titanium dioxide in the reflective agent has an average particle size in a range of 0.05 to 5.0 μm.

15. The molded part of claim 10, wherein the (F) antioxidant is phenolic, phosphorous-based or sulfur-based.

16. The molded part of claim 10, wherein the (F) antioxidant is phenolic or phosphorous-based.

\* \* \* \* \*